United States Patent
Kim

(10) Patent No.: US 9,214,220 B1
(45) Date of Patent: Dec. 15, 2015

(54) SEMICONDUCTOR MEMORY APPARATUS

(71) Applicant: SK hynix Inc., Icheon-si Gyeonggi-do (KR)

(72) Inventor: Do Hong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/565,086

(22) Filed: Dec. 9, 2014

(30) Foreign Application Priority Data

Sep. 5, 2014 (KR) .......................... 10-2014-0118864

(51) Int. Cl.
*G11C 5/14* (2006.01)
*G11C 7/22* (2006.01)
*G11C 7/08* (2006.01)
*G11C 11/406* (2006.01)
*G11C 11/4074* (2006.01)
*G11C 11/4091* (2006.01)
*G11C 11/4093* (2006.01)
*G11C 11/4076* (2006.01)
*G11C 16/26* (2006.01)
*G11C 13/00* (2006.01)
*G11C 16/30* (2006.01)

(52) U.S. Cl.
CPC .......... *G11C 11/4091* (2013.01); *G11C 11/406* (2013.01); *G11C 11/4076* (2013.01); *G11C 11/4093* (2013.01); *G11C 5/14* (2013.01); *G11C 7/08* (2013.01); *G11C 11/4074* (2013.01); *G11C 11/40615* (2013.01); *G11C 13/0038* (2013.01); *G11C 16/26* (2013.01); *G11C 16/30* (2013.01)

(58) Field of Classification Search
CPC .. G11C 5/14; G11C 11/4074; G11C 13/0038; G11C 7/08; G11C 16/26; G11C 16/30; G11C 11/40615

USPC .......... 365/189.09, 191, 196, 222, 205, 207, 365/230.03

See application file for complete search history.

(56) References Cited

U.S. PATENT DOCUMENTS

2005/0231991 A1* 10/2005 Horiguchi .............. G11C 5/063 365/63
2009/0034334 A1* 2/2009 Furuyama .............. G11C 16/12 365/185.11

(Continued)

FOREIGN PATENT DOCUMENTS

KR 1020060039266 A 5/2006
KR 1020100064904 A 6/2010

* cited by examiner

*Primary Examiner* — Ly D Pham
(74) *Attorney, Agent, or Firm* — William Park & Associates Ltd.

(57) ABSTRACT

A semiconductor memory apparatus includes a control signal generation unit configured to generate a control signal according to a mode control signal and a refresh signal; a first sense amplifier driving voltage generation unit configured to generate a first sense amplifier driving voltage according to the control signal, a first sense amplifier enable signal and a switching control signal; a switching control unit configured to generate the switching control signal according to the control signal and a second sense amplifier enable signal; a second sense amplifier driving voltage generation unit configured to generate a second sense amplifier driving voltage according to the second sense amplifier enable signal; and a switching unit configured to electrically couple or decouple output nodes of the first sense amplifier driving voltage generation unit and the second sense amplifier driving voltage generation unit according to the switching control signal.

20 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean application number 10-2014-0118864, filed on Sep. 5, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

Semiconductor memory apparatuses are configured to store data and output stored data. Semiconductor memory apparatuses are divided into a volatile semiconductor memory apparatus and a nonvolatile semiconductor memory apparatus according to a scheme of storing data.

A volatile semiconductor memory apparatus and a nonvolatile semiconductor memory apparatus may be divided according to whether a refresh operation is performed or not to retain stored data.

The volatile semiconductor memory apparatus should be accompanied with the refresh operation to retain stored data. In this regard, research has continuously been made to reduce the current consumption of the refresh operation.

SUMMARY

In an embodiment, a semiconductor memory apparatus may include a control signal generation unit configured to generate a control signal according to a mode control signal and a refresh signal. The semiconductor memory apparatus may also include a first sense amplifier driving voltage generation unit configured to generate a first sense amplifier driving voltage according to the control signal, a first sense amplifier enable signal and a switching control signal. The semiconductor memory apparatus may also include a switching control unit configured to generate the switching control signal according to the control signal and a second sense amplifier enable signal. Further, the semiconductor memory apparatus may also include a second sense amplifier driving voltage generation unit configured to generate a second sense amplifier driving voltage according to the second sense amplifier enable signal. The semiconductor memory apparatus may also include a switching unit configured to electrically couple or electrically decouple an output node of the first sense amplifier driving voltage generation unit and an output node of the second sense amplifier driving voltage generation unit according to the switching control signal.

In an embodiment, a semiconductor memory apparatus may include a voltage generation block configured to generate a first sense amplifier driving voltage during an enable period of a first sense amplifier enable signal or to generate the first sense amplifier driving voltage during a period longer than the enable period of the first sense amplifier enable signal, according to a mode control signal and a refresh signal. The semiconductor memory apparatus may also include a second sense amplifier driving voltage generation unit configured to generate a second sense amplifier driving voltage during an enable period of a second sense amplifier enable signal. Further, the semiconductor memory apparatus may include a power line control block configured to electrically couple or electrically decouple a power line of a first sense amplifier and a power line of a second sense amplifier according to the second sense amplifier enable signal where the first sense amplifier driving voltage is generated during the period longer than the enable period of the first sense amplifier enable signal.

In an embodiment, a semiconductor memory apparatus may include a control signal generation unit configured to enable a control signal when a refresh signal and a mode control signal are enabled, and disable the control signal when a voltage application enable signal is disabled. The semiconductor memory apparatus may also include a first sense amplifier driving voltage generation unit configured to generate the first sense amplifier driving voltage when the control signal is enabled and to generate a first sense amplifier driving voltage when the control signal is disabled. Further, the semiconductor memory apparatus may include a switching control unit configured to generate a switching control signal when the control signal and a second sense amplifier enable signal are enabled. The semiconductor memory apparatus may also include a second sense amplifier driving voltage generation unit configured to generate a second sense amplifier driving voltage when the second sense amplifier enable signal is enabled. In addition, the semiconductor memory apparatus may include a switching unit configured to electrically couple a power line for the first sense amplifier and a power line for the second sense amplifier according to the switching control signal.

DETAILED DESCRIPTION

Hereinafter, a semiconductor memory apparatus will be described below with reference to the accompanying figures through various embodiments.

Figure 1:
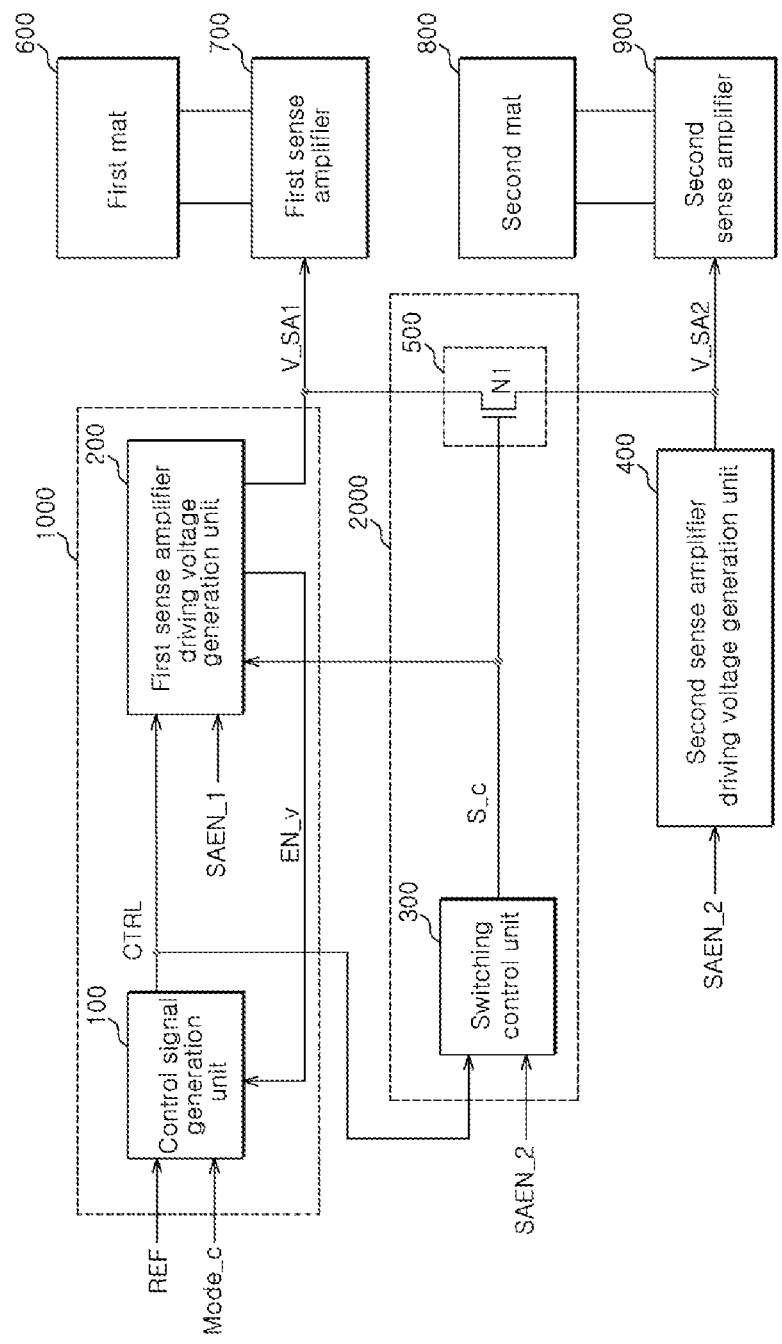
FIG. 1 is a configuration diagram illustrating a representation of an example of a semiconductor memory apparatus in accordance with an embodiment.

Referring to FIG. 1, a semiconductor memory apparatus in accordance with an embodiment includes a control signal generation unit 100, a first sense amplifier driving voltage generation unit 200, a switching control unit 300, a second sense amplifier driving voltage generation unit 400, a switching unit 500, a first mat 600, a first sense amplifier 700, a second mat 800, and a second sense amplifier 900.

The control signal generation unit 100 generates a control signal CTRL in response to a mode control signal Mode_c and a refresh signal REF. For example, the control signal generation unit 100 enables the control signal CTRL when the refresh signal REF is enabled in a state in which the mode control signal Mode_c is enabled. The control signal generation unit 100 disables the control signal CTRL when a voltage application enable signal EN_v is disabled. The mode control signal Mode_c is a signal which allows the semiconductor memory apparatus to continuously perform a refresh operation even though the refresh signal REF is inputted only one time, when it is enabled. Further, the mode control signal Mode_c allows the semiconductor memory apparatus to perform the refresh operation one time when the refresh signal REF is inputted one time, when it is disabled. The mode control signal Mode_c may be an output signal of a mode register set.

The first sense amplifier driving voltage generation unit 200 generates a first sense amplifier driving voltage V_SA1 in response to the control signal CTRL, a first sense amplifier enable signal SAEN_1 and a switching control signal S_c. For example, the first sense amplifier driving voltage generation unit 200 generates the first sense amplifier driving voltage V_SA1 during the enable period of the first sense amplifier enable signal SAEN_1 when the control signal CTRL is disabled. The first sense amplifier driving voltage generation unit 200 also generates the first sense amplifier driving voltage V_SA1 during a period longer than the enable period of the first sense amplifier enable signal SAEN_1 when the control signal CTRL is enabled. More specifically, the first sense amplifier driving voltage generation unit 200 generates the first sense amplifier driving voltage V_SA1 during the same period as the enable period of the first sense amplifier enable signal SAEN_1 when the control signal CTRL is disabled. The first sense amplifier driving voltage generation unit 200 generates the first sense amplifier driving voltage V_SA1 from when the first sense amplifier enable signal SAEN_1 is enabled to until a predetermined time passes after the switching control signal S_c is enabled, when the control signal CTRL is enabled.

The switching control unit 300 generates the switching control signal S_c in response to the control signal CTRL and a second sense amplifier enable signal SAEN_2. For instance, the switching control unit 300 generates the switching control signal S_c enabled for the predetermined period, when the control signal CTRL is enabled and the second sense amplifier enable signal SAEN_2 is enabled.

The second sense amplifier driving voltage generation unit 400 generates a second sense amplifier driving voltage V_SA2 during the enable period of the second sense amplifier enable signal SAEN_2.

The switching unit 500 electrically couples or electrically decouples the power line of the first sense amplifier 700 for transferring the first sense amplifier driving voltage V_SA1 to the first sense amplifier 700. The switching unit 500 also electrically couples or electrically decouples the power line of the second sense amplifier 900 for transferring the second sense amplifier driving voltage V_SA2 to the second sense amplifier 900, in response to the switching control signal S_c. For example, the switching unit 500 electrically couples the power line of the first sense amplifier 700 and the power line of the second sense amplifier 900 when the switching control signal S_c is enabled. The switching unit 500 (which includes a transistor N1) electrically decouples the power line of the first sense amplifier 700 and the power line of the second sense amplifier 900 when the switching control signal S_c is disabled. Since the power line of the first sense amplifier 700 transfers the first sense amplifier driving voltage V_SA1, the power line of the first sense amplifier 700 is electrically coupled with the output node of the first sense amplifier driving voltage generation unit 200. In addition, since the power line of the second sense amplifier 900 transfers the second sense amplifier driving voltage V_SA2, the power line of the second sense amplifier 900 is electrically coupled with the output node of the second sense amplifier driving voltage generation unit 400.

The first mat 600 serves as a region to store data. The first mat 600 also includes a plurality of memory cells.

The first sense amplifier 700 is electrically coupled with the first mat 600. The first sense amplifier 700 also performs an operation of sensing and amplifying the data stored in the first mat 600.

The second mat 800 serves as a region to store data. The second mat also 800 includes a plurality of memory cells.

The second sense amplifier 900 is electrically coupled with the second mat 800. The second sense amplifier 900 also performs an operation of sensing and amplifying the data stored in the second mat 800. In the refresh operation, the first and second sense amplifiers 700 and 900 perform the refresh operation by performing the operations of sensing and amplifying the data stored in the first mat 600 and the second mat 800 respectively electrically coupled therewith.

Figure 2:
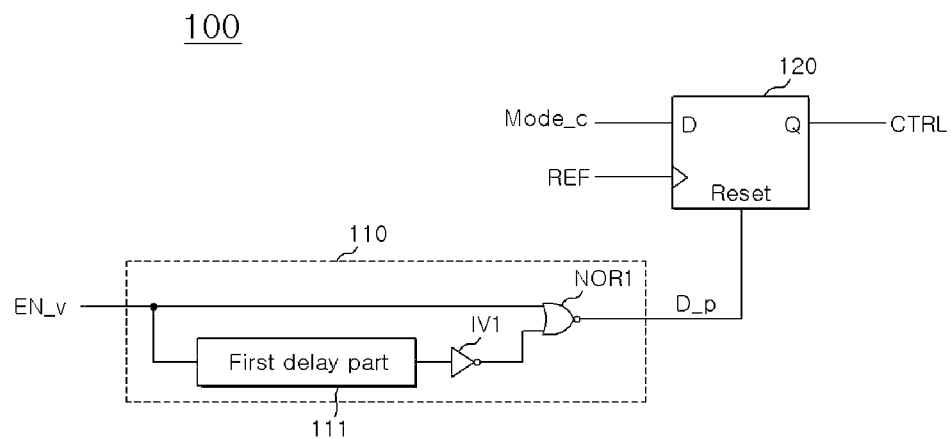
FIG. 2 is a configuration diagram illustrating a representation of an example of the control signal generation unit shown in FIG. 1.

Referring to FIG. 2, the control signal generation unit 100 includes a pulse generating section 110, and a first latch section 120.

The pulse generating section 110 generates a disable pulse D_p which has an enable period corresponding to a preselected time, when the voltage application enable signal EN_v is disabled.

The pulse generating section 110 includes a first delay part 111, a first inverter IV1, and a NOR gate NOR1. The first delay part 111 is inputted with the voltage application enable signal EN_v. The first inverter IV1 is inputted with the output signal of the first delay part 111. The NOR gate NOR1 is inputted with the voltage application enable signal EN_v and the output signal of the first inverter IV1. The NOR gate NOR1 also generates the disable pulse D_p.

The pulse generating section 110 configured in this way generates the disable pulse D_p enabled to a high level for the preselected time, when the voltage application enable signal EN_v is disabled to a low level.

The first latch section 120 may be configured by a flip-flop. The first latch section 120 outputs the level of the mode control signal Mode_c at the time when the refresh signal REF is enabled, as the level of the control signal CTRL. The first latch section 120 also disables the control signal CTRL if the disable pulse D_p is inputted.

Figure 3:
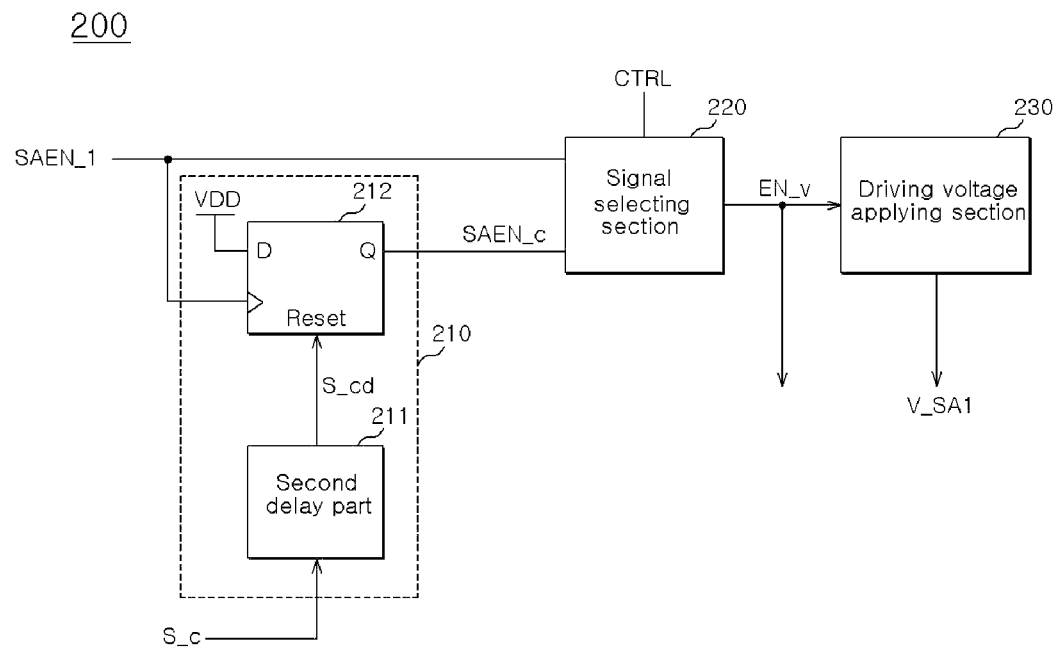
FIG. 3 is a configuration diagram illustrating a representation of an example of the first sense amplifier driving voltage generation unit shown in FIG. 1.

Referring to FIG. 3, the first sense amplifier driving voltage generation unit 200 includes an enable extension signal generating section 210, a signal selecting section 220, and a driving voltage applying section 230.

The enable extension signal generating section 210 enables a sense amplifier enable extension signal SAEN_c in response to the first sense amplifier enable signal SAEN_1. The enable extension signal generating section 210 also disables the sense amplifier enable extension signal SAEN_c in response to the switching control signal S_c. In detail, the enable extension signal generating section 210 enables the sense amplifier enable extension signal SAEN_c when the first sense amplifier enable signal SAEN_1 is enabled. Further the enable extension signal generating section 210 disables the sense amplifier enable extension signal SAEN_c when the predetermined time passes after the switching control signal S_c is enabled.

The enable extension signal generating section 210 includes a second delay part 211 and a second latch section 212. The second delay part 211 delays the switching control signal S_c, and outputs a delayed switching control signal S_cd. The second latch section 212 enables the sense amplifier enable extension signal SAEN_c to the level of an external voltage VDD, that is, a high level, when the first sense amplifier enable signal SAEN_1 is enabled, and retains the enabled sense amplifier enable extension signal SAEN_c. The second latch section 212 disables the sense amplifier enable extension signal SAEN_c when the delayed switching control signal S_cd is enabled.

The signal selecting section 220 outputs one of the first sense amplifier enable signal SAEN_1 and the sense amplifier enable extension signal SAEN_c, as the voltage application enable signal EN_v, in response to the control signal CTRL. For instance, the signal selecting section 220 outputs the sense amplifier enable extension signal SAEN_c as the voltage application enable signal EN_v when the control signal CTRL is enabled. The signal selecting section 220 outputs the first sense amplifier enable signal SAEN_1 as the voltage application enable signal EN_v when the control signal CTRL is disabled.

The driving voltage applying section 230 generates the first sense amplifier driving voltage V_SA1 during the enable period of the voltage application enable signal EN_v.

Figure 4:
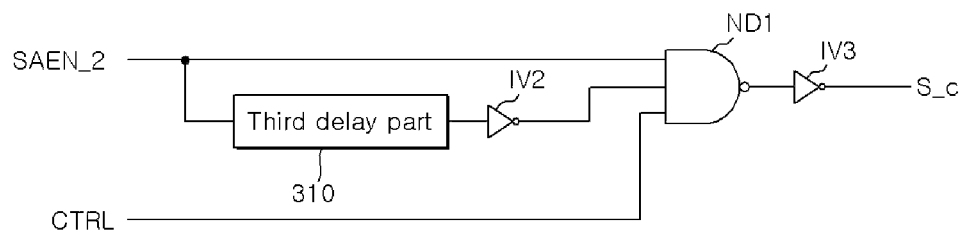
FIG. 4 is a configuration diagram illustrating a representation of an example of the switching control unit shown in FIG. 1.

Referring to FIG. 4, the switching control unit 300 includes a third delay part 310, second and third inverters IV2 and IV3, and a NAND gate ND1. The third delay part 310 is inputted with the second sense amplifier enable signal SAEN_2. The second inverter IV2 is inputted with the output signal of the third delay part 310. The NAND gate ND1 is inputted with the second sense amplifier enable signal SAEN_2, the output signal of the second inverter IV2, and the control signal CTRL. The third inverter IV3 is inputted with the output signal of the NAND gate ND1. The third inverter IV3 also outputs the switching control signal S_c.

The switching control unit 300 generates the switching control signal S_c enabled for the predetermined time, if the second sense amplifier enable signal SAEN_2 is enabled only when the control signal CTRL is enabled.

Operations of the semiconductor memory apparatus in accordance with the embodiment, configured as mentioned above, will be described below.

First, descriptions will be made for the case where the refresh operation is continuously performed, or, the case where the refresh signal REF is inputted in the state in which the mode control signal Mode_c is enabled.

The control signal generation unit 100 retains the enabled state of the control signal CTRL until the voltage application enable signal EN_v is disabled, if the refresh signal REF is enabled in the state in which the mode control signal Mode_c is enabled. More specifically, the control signal generation unit 100 enables the control signal CTRL if the refresh signal REF is enabled in the state in which the mode control signal Mode_c is enabled. The control signal generation unit 100 disables the enabled control signal CTRL when the voltage application enable signal EN_v is disabled.

The first sense amplifier driving voltage generation unit 200 generates the first sense amplifier driving voltage V_SA1 during the period longer than the enable period of the first sense amplifier enable signal SAEN_1, when the control signal CTRL is enabled. In detail, the first sense amplifier driving voltage generation unit 200 generates the first sense amplifier driving voltage V_SA1 if the first sense amplifier enable signal SAEN_1 is enabled in the state in which the control signal CTRL is enabled. The first sense amplifier driving voltage generation unit 200 interrupts the generation of the first sense amplifier driving voltage V_SA1 when the predetermined time passes after the switching control signal S_c is enabled. Since the switching control signal S_c is a signal enabled for the predetermined time when the second sense amplifier enable signal SAEN_2 is enabled, in the state in which the control signal CTRL is enabled, the first sense amplifier driving voltage generation unit 200 starts to generate the first sense amplifier driving voltage V_SA1 when the first sense amplifier enable signal SAEN_1 is enabled. Further, the first sense amplifier driving voltage generation unit 200 generates the first sense amplifier driving voltage V_SA1 until the predetermined time passes after the second sense amplifier enable signal SAEN_2 is enabled.

The switching control unit 300 generates the switching control signal S_c enabled for the predetermined time, when the control signal CTRL is enabled and the second sense amplifier enable signal SAEN_2 is enabled.

The second sense amplifier driving voltage generation unit 400 generates the second sense amplifier driving voltage V_SA2 during the enable period of the second sense amplifier enable signal SAEN_2.

The switching unit 500 electrically couples the power line through which the first sense amplifier driving voltage V_SA1 is transferred and the power line through which the second sense amplifier driving voltage V_SA2 is transferred, when the switching control signal S_c is enabled. If the switching control signal S_c is disabled, the switching unit 500 electrically decouples the power line through which the first sense amplifier driving voltage V_SA1 is transferred and the power line through which the second sense amplifier driving voltage V_SA2 is transferred. The power line through which the first sense amplifier driving voltage V_SA1 is transferred is a power line electrically coupling the output node of the first sense amplifier driving voltage generation unit 200, from which the first sense amplifier driving voltage V_SA1 is outputted, and the first sense amplifier 700. The power line through which the second sense amplifier driving voltage V_SA2 is transferred is a power line electrically coupling the output node of the second sense amplifier driving voltage generation unit 400, from which the second sense amplifier driving voltage V_SA2 is outputted, and the second sense amplifier 900.

Figure 5:
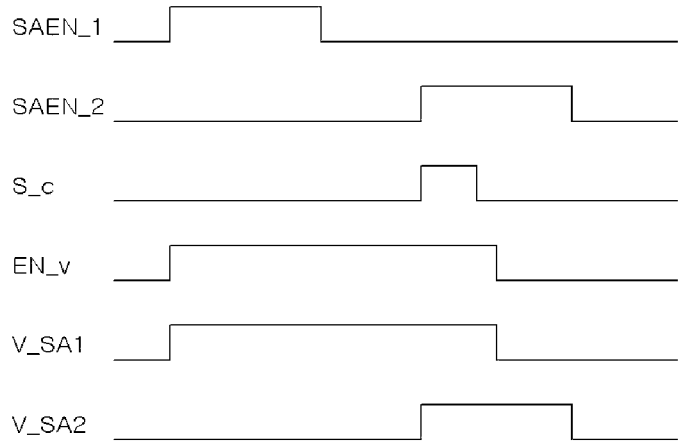
FIG. 5 is a representation of an example of a timing diagram to assist in the explanation of the semiconductor memory apparatus in accordance with an embodiment.
Figure 5:
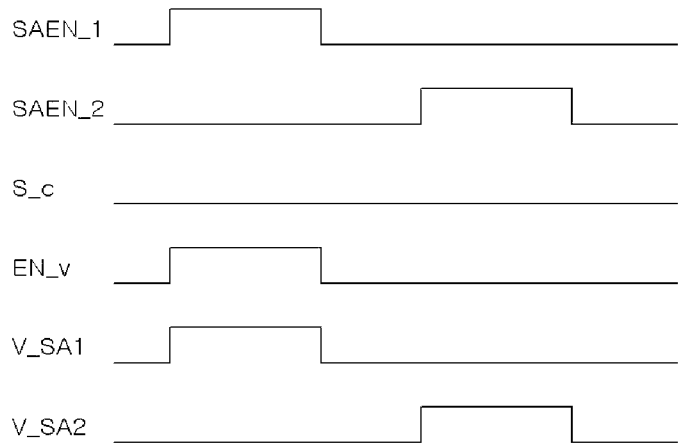

The operations of the semiconductor memory apparatus in accordance with an embodiment will be summarized below with reference to FIGS. 1 and 5 below.

When the control signal CTRL is enabled, the voltage application enable signal EN_v is enabled when the first sense amplifier enable signal SAEN_1 is enabled.

The voltage application enable signal EN_v is disabled when the predetermined time passes after the switching control signal S_c is enabled.

The first sense amplifier driving voltage V_SA1 is generated when the first sense amplifier enable signal SAEN_1 is enabled. Further, the generation of the first sense amplifier driving voltage V_SA1 is interrupted when the voltage application enable signal EN_v is disabled.

The second sense amplifier driving voltage V_SA2 is generated during the same period as the enable period of the second sense amplifier enable signal SAEN_2.

If the second sense amplifier enable signal SAEN_2 is enabled, the switching control signal S_c enabled for the predetermined time is enabled.

Accordingly, a period in which the generation period of the first sense amplifier driving voltage V_SA1 and the generation period of the second sense amplifier driving voltage V_SA2 overlap with each other occurs, and the overlapping period corresponds to the enable period of the switching control signal S_c. During such enable period of the switching control signal S_c, the power line through which the first sense amplifier driving voltage V_SA1 is transferred and the power line through which the second sense amplifier driving voltage V_SA2 is transferred are electrically coupled.

Accordingly, the first sense amplifier driving voltage V_SA1 which has driven the first sense amplifier 700 is used as a driving voltage in the initial driving stage of the second sense amplifier 900.

When the control signal CTRL is disabled, the switching control signal S_c is not enabled. The voltage application enable signal EN_v is generated during the same period as the enable period of the first sense amplifier enable signal SAEN_1.

Accordingly, the generation period of the first sense amplifier driving voltage V_SA1 is the same as the enable period of the first sense amplifier enable signal SAEN_1. In addition, the generation period of the second sense amplifier driving voltage V_SA2 is the same as the enable period of the second sense amplifier enable signal SAEN_2.

As a result, the first sense amplifier 700 operates by being applied with only the first sense amplifier driving voltage V_SA1. Further, the second sense amplifier 900 operates by being applied with only the second sense amplifier driving voltage V_SA2.

The control signal generation unit 100 and the first sense amplifier driving voltage generation unit 200 may configure a voltage generation block 1000 which generates the first sense amplifier driving voltage V_SA1 during the enable period of the first sense amplifier enable signal SAEN_1. Alternatively, the voltage generation block 1000 generates the first sense amplifier driving voltage V_SA1 during a period longer than the enable period of the first sense amplifier enable signal SAEN_1, in response to the mode control signal Mode_c and the refresh signal REF. The switching control unit 300 and the switching unit 400 may configure a power line control block 2000 which electrically couples or electrically decouples the power line of the first sense amplifier 700 and the power line of the second sense amplifier 900 in response to the second sense amplifier enable signal SAEN_2 when the first sense amplifier driving voltage V_SA1 is generated during a period longer than the enable period of the first sense amplifier enable signal SAEN_1.

Figure 6:
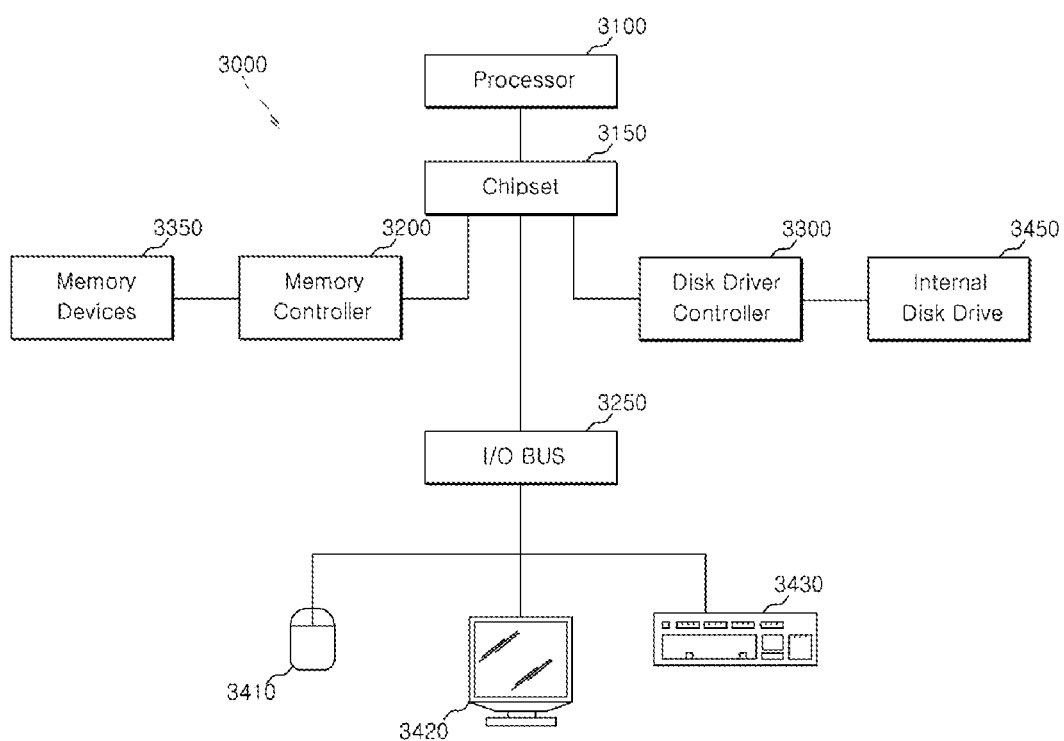
FIG. 6 illustrates a block diagram of a system employing a memory controller circuit in accordance with an embodiment of the invention.

Referring to FIG. 6, a system 3000 may include one or more processors 3100. The processor 3100 may be used individually or in combination with other processors. A chipset 3150 may be electrically coupled to the processor 3100. The chipset 3150 is a communication pathway for signals between the processor 3100 and other components of the system 3000. Other components of the system 3000 may include a memory controller 3200, an input/output ("I/O") bus 3250, and a disk drive controller 3300. Depending on the configuration of the system 3000, any one of a number of different signals may be transmitted through the chipset 3150.

The memory controller 3200 may be electrically coupled to the chipset 3150. The memory controller 3200 can receive a request provided from the processor 3100 through the chipset 3150. The memory controller 3200 may be electrically coupled to one or more memory devices 3350. The memory devices 3350 may include the semiconductor memory apparatus described above.

The chipset 3150 may also be electrically coupled to the I/O bus 3250. The I/O bus 3250 may serve as a communication pathway for signals from the chipset 3150 to I/O devices 3410, 3420 and 3430. The I/O devices 3410, 3420 and 3430 may include a mouse 3410, a video display 3420, or a keyboard 3430. The I/O bus 3250 may employ any one of a number of communications protocols to communicate with the I/O devices 3410, 3420, and 3430.

The disk drive controller 3300 may also be electrically coupled to the chipset 3150. The disk drive controller 3300 may serve as the communication pathway between the chipset 3150 and one or more internal disk drives 3450. The disk drive controller 3300 and the internal disk drives 3450 may communicate with each other or with the chipset 3150 using virtually any type of communication protocol.

As is apparent from the above descriptions, in the semiconductor memory apparatus in accordance with an embodiment, the sense amplifier driving voltage applied to a sense amplifier which is first driven in a refresh operation is used as the driving voltage of a sense amplifier which is second driven. As a result, the sense amplifier which is second driven may operate by being applied with a driving voltage with a target level from an initial driving stage. In addition, since the voltage level of a driving voltage outputted by a sense amplifier driving voltage generation unit to generate the driving voltage of the sense amplifier to be second driven may be easily raised to the target level, it is possible to reduce current to be consumed to raise the driving voltage to the target level.

While various embodiments have been described above, it will be understood to those skilled in the art that the embodiments described are by way of examples only. Accordingly, the semiconductor memory apparatus described should not be limited based on the above described embodiments.

What is claimed is:

1. A semiconductor memory apparatus comprising:
   a control signal generation unit configured to generate a control signal according to a mode control signal and a refresh signal;
   a first sense amplifier driving voltage generation unit configured to generate a first sense amplifier driving voltage according to the control signal, a first sense amplifier enable signal and a switching control signal;
   a switching control unit configured to generate the switching control signal according to the control signal and a second sense amplifier enable signal;
   a second sense amplifier driving voltage generation unit configured to generate a second sense amplifier driving voltage according to the second sense amplifier enable signal; and
   a switching unit configured to electrically couple or electrically decouple an output node of the first sense amplifier driving voltage generation unit and an output node of the second sense amplifier driving voltage generation unit according to the switching control signal.

2. The semiconductor memory apparatus according to claim 1, wherein the control signal generation unit enables the control signal if the refresh signal is enabled in a state where the mode control signal is enabled, and disables the control signal when a voltage application enable signal is disabled.

3. The semiconductor memory apparatus according to claim 2, wherein the control signal generation unit comprises:
   a latch section configured to latch a voltage level of the mode control signal when the refresh signal is enabled and output the control signal, and disable the control signal when a disable pulse is inputted; and
   a pulse generating section configured to generate the disable pulse when the voltage application enable signal is disabled.

4. The semiconductor memory apparatus according to claim 2,
   wherein the first sense amplifier driving voltage generation unit generates the first sense amplifier driving voltage during an enable period of the first sense amplifier enable signal when the control signal is disabled, and wherein the first sense amplifier driving voltage generation unit generates the first sense amplifier driving voltage during a period longer than the enable period of the first sense amplifier enable signal when the control signal is enabled.

5. The semiconductor memory apparatus according to claim 4, wherein the first sense amplifier driving voltage generation unit comprises:
   an enable extension signal generating section configured to enable a sense amplifier enable extension signal in response to the first sense amplifier enable signal, and disable the sense amplifier enable extension signal in response to the switching control signal;
   a signal selecting section configured to output one of the first sense amplifier enable signal and the sense amplifier enable extension signal as the voltage application enable signal in response to the control signal; and
   a driving voltage applying section configured to generate the first sense amplifier driving voltage during an enable period of the voltage application enable signal.

6. The semiconductor memory apparatus according to claim 5, wherein the enable extension signal generating section comprises:
   a delay part configured to delay the switching control signal, and generate a delayed switching control signal; and
   a latch section configured to enable the sense amplifier enable extension signal and retain an enabled state when the first sense amplifier enable signal is enabled, and disable the sense amplifier enable extension signal when the delayed switching control signal is enabled.

7. The semiconductor memory apparatus according to claim 1, wherein the switching control unit generates the switching control signal enabled for a predetermined time, when the second sense amplifier enable signal is enabled in a state where the control signal is enabled.

8. The semiconductor memory apparatus according to claim 1, wherein the switching unit electrically couples the output node of the first sense amplifier driving voltage generation unit and the output node of the second sense amplifier driving voltage generation unit when the switching control signal is enabled, and electrically decouples the output node of the first sense amplifier driving voltage generation unit and the output node of the second sense amplifier driving voltage generation unit when the switching control signal is disabled.

9. A semiconductor memory apparatus comprising:
   a voltage generation block configured to generate a first sense amplifier driving voltage during an enable period of a first sense amplifier enable signal or to generate the first sense amplifier driving voltage during a period longer than the enable period of the first sense amplifier enable signal, according to a mode control signal and a refresh signal;
   a second sense amplifier driving voltage generation unit configured to generate a second sense amplifier driving voltage during an enable period of a second sense amplifier enable signal; and
   a power line control block configured to electrically couple or electrically decouple a power line of a first sense amplifier and a power line of a second sense amplifier according to the second sense amplifier enable signal where the first sense amplifier driving voltage is generated during the period longer than the enable period of the first sense amplifier enable signal.

10. The semiconductor memory apparatus according to claim 9,
    wherein the first sense amplifier driving voltage is applied to the first sense amplifier through the power line of the first sense amplifier, and
    wherein the second sense amplifier driving voltage is applied to the second sense amplifier through the power line of the second sense amplifier.

11. The semiconductor memory apparatus according to claim 9, wherein the voltage generation block comprises:
    a control signal generation unit configured to enable a control signal when the mode control signal is enabled and the refresh signal is enabled, and disable the control signal in response to the second sense amplifier enable signal; and
    a first sense amplifier driving voltage generation unit configured to generate the first sense amplifier driving voltage during the period longer than the enable period of the first sense amplifier enable signal when the control signal is enabled, and generate the first sense amplifier driving voltage during the enable period of the first sense amplifier enable signal when the control signal is disabled.

12. The semiconductor memory apparatus according to claim 11, wherein the control signal generation unit enables the control signal when mode control signal is enabled and the refresh signal is enabled, and disables the control signal when a voltage application enable signal is disabled.

13. The semiconductor memory apparatus according to claim 12, wherein the first sense amplifier driving voltage generation unit comprises:
    an enable extension signal generating section configured to enable a sense amplifier enable extension signal when the first sense amplifier enable signal is enabled, and disable the sense amplifier enable extension signal when a predetermined time passes after a switching control signal is enabled;
    a signal selecting section configured to output the first sense amplifier enable signal as the voltage application enable signal when the control signal is disabled, and output the sense amplifier enable extension signal as the voltage application enable signal when the control signal is enabled; and
    a driving voltage applying section configured to generate the first sense amplifier driving voltage during an enable period of the voltage application enable signal.

14. The semiconductor memory apparatus according to claim 13, wherein the power line control block comprises:
    a switching control unit configured to generate the switching control signal enabled for the predetermined time, when the second sense amplifier enable signal is enabled in a state where the control signal is enabled; and
    a switching unit configured to electrically couple or electrically decouple the power line of the first sense amplifier and the power line of the second sense amplifier in response to the switching control signal.

15. A semiconductor memory apparatus comprising:
    a control signal generation unit configured to enable a control signal when a refresh signal and a mode control signal are enabled, and disable the control signal when a voltage application enable signal is disabled;
    a first sense amplifier driving voltage generation unit configured to generate the first sense amplifier driving voltage when the control signal is enabled and to generate a first sense amplifier driving voltage when the control signal is disabled;

a switching control unit configured to generate a switching control signal when the control signal and a second sense amplifier enable signal are enabled;

a second sense amplifier driving voltage generation unit configured to generate a second sense amplifier driving voltage when the second sense amplifier enable signal is enabled; and a switching unit configured to electrically couple a power line for the first sense amplifier and a power line for the second sense amplifier according to the switching control signal.

16. The semiconductor memory apparatus according to claim 15, further comprising:

a first sense amplifier configured electrically coupled to a first mat and configured to sense and amplify data stored in the first mat; and a second sense amplifier electrically coupled to a second mat and configured to sense and amplify data stored in the second mat.

17. The semiconductor memory apparatus according to claim 15, wherein the mode control signal allows a refresh operation to be continuously performed.

18. The semiconductor memory apparatus according to claim 15, further comprising:

a latch section configured to output a level of the mode control signal when the refresh signal is enabled as a level of the control signal.

19. The semiconductor memory apparatus according to claim 15, wherein the control signal generation unit is configured to retain an enabled state of the control signal until the voltage application enable signal is disabled when the refresh signal is enabled.

20. The semiconductor memory apparatus according to claim 15, wherein the mode control signal allows a refresh operation to be performed one time when the refresh signal is disabled.

* * * * *